(12) United States Patent
Fabien et al.

(10) Patent No.: US 11,120,977 B2
(45) Date of Patent: Sep. 14, 2021

(54) CONDUCTIVE OXIDE-COATED ELECTRODES VIA NANO- OR MICRO-STRUCTURED MATERIALS

(71) Applicant: Modern Electron, LLC, Bellevue, WA (US)

(72) Inventors: Chloe A. M. Fabien, Seattle, WA (US); Max N. Mankin, Seattle, WA (US); Tony S. Pan, Bellevue, WA (US); Yong Sun, Belle Mead, NJ (US)

(73) Assignee: Modern Electron, Inc., Bothell, WA (US)

( * ) Notice: Subject to any disclaimer, the term of this patent is extended or adjusted under 35 U.S.C. 154(b) by 821 days.

(21) Appl. No.: 15/800,912

(22) Filed: Nov. 1, 2017

(65) Prior Publication Data
US 2018/0144915 A1     May 24, 2018

Related U.S. Application Data

(60) Provisional application No. 62/425,387, filed on Nov. 22, 2016.

(51) Int. Cl.
*B32B 15/04* (2006.01)
*H01J 45/00* (2006.01)
(Continued)

(52) U.S. Cl.
CPC ............ *H01J 45/00* (2013.01); *B05D 1/005* (2013.01); *B05D 1/02* (2013.01); *C23C 14/221* (2013.01); *C23C 16/45525* (2013.01)

(58) Field of Classification Search
CPC .. B32B 3/00; B32B 3/26; B32B 3/263; B32B 3/30; B32B 15/00; B32B 15/01; C23C 14/08; C23C 14/081; C23C 14/082; C23C 14/088; C23C 16/40; C23C 16/403; C23C 16/404; C23C 16/409; H01J 1/00; H01J 1/02; H01J 1/13; H01J 1/14; H01J 1/142; H01J 1/144; H01J 1/146
See application file for complete search history.

(56) References Cited

U.S. PATENT DOCUMENTS 6,563,256 B1   5/2003   Zavadil et al.
7,138,754 B2   11/2006  Han et al.
(Continued)

OTHER PUBLICATIONS

Shakouri et al., "Enhanced Thermionic Emission Cooling in High Barrier Superlattice Heterostructures", Dec. 1998, Material Research Society Symposium Proceedings, vol. 545, pp. 449-458 (Year: 1998).*

(Continued)

*Primary Examiner* — Zachary M Davis
(74) *Attorney, Agent, or Firm* — Clements Bernard Walker; Robert R. Richardson

(57) ABSTRACT

Disclosed embodiments include conductive oxide-coated electrodes and methods of fabricating a conductive oxide-coated electrode. In a non-limiting embodiment, a conductive oxide-coated electrode includes: a conductive layer; and an oxide coating disposed on the conductive layer. In another non-limiting embodiment, a method of fabricating a conductive oxide-coated electrode includes: patterning a conductive layer; etching the patterned conductive layer; and disposing an oxide coating on the etched conductive layer.

28 Claims, 7 Drawing Sheets

(51) Int. Cl.
  *C23C 16/455* (2006.01)
  *C23C 14/22* (2006.01)
  *B05D 1/00* (2006.01)
  *B05D 1/02* (2006.01)

(56) References Cited

U.S. PATENT DOCUMENTS

2009/0237597 A1* 9/2009 Maniwa ............... H01J 61/78
 349/70
2015/0243867 A1* 8/2015 Geballe ............... H01J 45/00
 136/205

OTHER PUBLICATIONS

Hodgson et al., "Processing and performance of a novel cathode material," Applied Surface Science 146 (1999), pp. 79-83.
Rutter et al., "Coated Powder Cathodes—Applications and Technology," Applications of Surface Science 2 (1979), pp. 118-127.
Zhao et al., "Scandate-added Tungsten Dispenser Cathode Fabrication for 220 GHz Sheet Beam Traveling Wave Tube Amplifier," IVEC 2012, pp. 47-48.

* cited by examiner

CONDUCTIVE OXIDE-COATED ELECTRODES VIA NANO- OR MICRO-STRUCTURED MATERIALS

PRIORITY CLAIM

The present application claims the priority and benefit of U.S. Provisional Patent Application Ser. No. 62/425,387 entitled "CONDUCTIVE OXIDE-COATED ELECTRODES VIA NANO- OR MICRO-STRUCTURED MATERIALS," filed on Nov. 22, 2016.

TECHNICAL FIELD

The present disclosure relates to conductive oxide-coated electrodes.

BACKGROUND

Conventional oxide-coated electrodes (such as cathodes) typically include a metal substrate (typically nickel or tungsten) coated with an electron-emissive material based on alkali- or alkaline-earth metal oxide. Modern formulations often use a mixture of a binder, barium oxide, calcium oxide, strontium oxide, and aluminum oxide. Such electrodes are manufactured by spraying or depositing, on the metal substrate, a carbonate mixture containing primarily barium carbonate ($BaCO_3$), which is then converted to barium oxide (BaO) by heating in an activation step. In the case of a cathode, during operation the alkali- or alkaline-earth metal oxide reacts with a reducing agent, such as Si, W, or Mg, to generate free barium and emit electrons.

Oxide-coated electrodes can offer high stability, high reliability, and low production cost. For example, due to their low work functions of ~1.4 eV (compared to ~1.9-2.0 eV for Ba/W dispenser cathodes), oxide cathodes can operate at low temperature (700-900 C) and offer higher currents at temperatures below 900 C, which is the lower threshold at which dispenser cathodes emit reasonable current densities. Additionally, because oxide-based cathodes were extensively used in cathode ray tube (CRT) televisions, mass-manufacturing techniques are better developed for barium oxide cathodes compared to Ba dispenser or $LaB_6$ cathodes.

However, because of the low charge carrier density of the barium oxide coating compared with metals, the current density of oxide electrodes is limited due to the limited density and supply of charged particles that are able to travel to-and-from the surface layer and thus be emitted from the electrode material. Also, Joule heating due to low conductivity of the semiconducting barium oxide-based material can cause melting, evaporation, and sintering of the oxide material, which can degrade the performance of the electrode and limit its lifetime. Additionally, the semiconducting barium oxide coating acts as a resistor, thereby imposing a voltage drop between the interface of the barium oxide electrode to the circuit wire and the emitting surface of the barium oxide electrode. This voltage drop can negatively affect (in some cases, significantly) the efficiency of a thermionic converter circuit by effectively nullifying the voltage gained at the electron collector of the thermionic converter. This drop in efficiency is why barium oxide electrodes, despite their dominance in vacuum tube technology, have not been used in thermionic converters.

Moreover, the spraying method for depositing the carbonate may result in non-uniform particle and void sizes and high surface roughness of the electron emissive layer. The resulting uneven emitting surface can degrade the luminance uniformity for CRT applications and shorten the lifetime of the cathode.

SUMMARY

Disclosed embodiments include conductive oxide-coated electrodes and methods of fabricating a conductive oxide-coated electrode.

In a non-limiting embodiment, a conductive oxide-coated electrode includes: a conductive layer; and an oxide coating disposed on the conductive layer.

In another non-limiting embodiment, a conductive oxide-coated electrode includes: a substrate; a conductive layer disposed on the substrate, the conductive layer including patterned features defined therein; and an oxide coating disposed on the conductive layer.

In another non-limiting embodiment, a conductive oxide-coated electrode includes: a patterned substrate; a conductive layer conformally deposited on the patterned substrate; and an oxide coating disposed on the conductive layer.

In another non-limiting embodiment, a conductive oxide-coated electrode includes: a substrate; and at least one composition disposed on the substrate, the composition being formed by a conductive layer and an oxide coating, the composition being chosen from an alloy, a composite, and a combination of an alloy and a composite.

In another non-limiting embodiment, a conductive oxide-coated electrode includes: a substrate; and an oxide coating disposed on the substrate, the oxide coating having conductive material disposed therein.

In another non-limiting embodiment, a method of fabricating a conductive oxide-coated electrode includes: patterning a conductive layer; etching the patterned conductive layer; and disposing an oxide coating on the etched conductive layer.

In another non-limiting embodiment, a method of fabricating a conductive oxide-coated electrode includes: providing a substrate; depositing a conductive layer on the substrate; patterning the conductive layer; etching the patterned conductive layer; and disposing an oxide coating on the etched conductive layer.

In another non-limiting embodiment, a method of fabricating a conductive oxide-coated electrode includes: providing a substrate; patterning the substrate; etching the patterned substrate; conformally depositing a conductive layer on the patterned substrate; and disposing an oxide coating on the conductive layer.

In another non-limiting embodiment, a method of fabricating a conductive oxide-coated electrode includes: providing a substrate; and simultaneously depositing on the substrate a conductive layer and an oxide coating.

In another non-limiting embodiment, a method of fabricating a conductive oxide-coated electrode includes: providing a substrate; and simultaneously depositing on the substrate an oxide coating and conductive material.

The foregoing is a summary and thus may contain simplifications, generalizations, inclusions, and/or omissions of detail; consequently, those skilled in the art will appreciate that the summary is illustrative only and is NOT intended to be in any way limiting. Other aspects, features, and advantages of the devices and/or processes and/or other subject matter described herein will become apparent in the text (e.g., claims and/or detailed description) and/or drawings of the present disclosure.

BRIEF DESCRIPTION OF THE FIGURES

Illustrative embodiments are illustrated in referenced figures of the drawings. It is intended that the embodiments and figures disclosed herein are to be considered illustrative rather than restrictive.

DETAILED DESCRIPTION

Figure 1A:
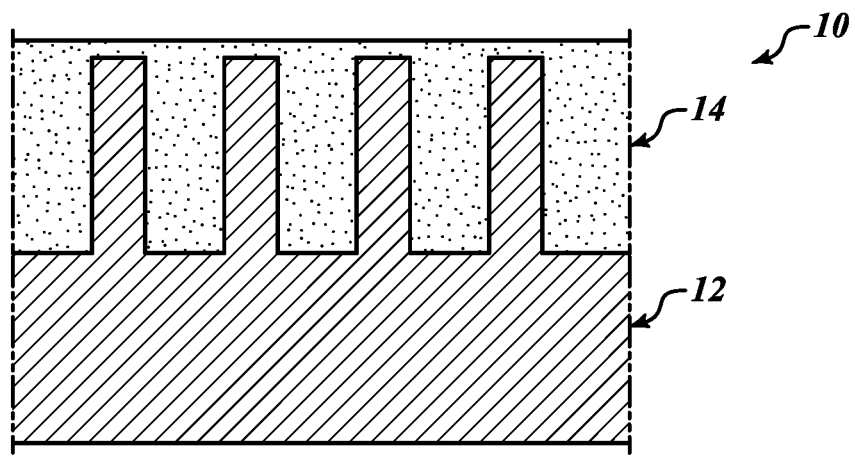
FIGS. 1A-1E illustrate examples of oxide-coated electrodes without an independent substrate.

In the following detailed description, reference is made to the accompanying drawings, which form a part hereof. In the drawings, the use of the same symbols in different drawings typically indicates similar or identical items unless context dictates otherwise. The illustrative embodiments described in the detailed description, drawings, and claims are not meant to be limiting. Other embodiments may be utilized, and other changes may be made, without departing from the spirit or scope of the subject matter presented here.

Overview

Given by way of non-limiting overview, illustrative structures and fabrication techniques are disclosed for conductive oxide-coated electrodes (such as electron-emitting cathodes or electron-absorbing anodes) via nano- or micro-structured materials. Such conductive oxide-coated electrodes may help reduce electrical resistance of the semiconducting oxide coating, thereby helping contribute to improve lifetime and/or performance of oxide-coated thermionic cathodes or other vacuum electronic electrodes.

Still by way of non-limiting overview, fabricating micro- and/or nano-scale conductive structures (such as, without limitation, an array of vertical interconnect accesses) and then either conformally coating the conductive structures or filling in empty portions between the conductive structures with an oxide coating such as without limitation barium oxide or other alkali- or alkaline-earth compounds, and/or incorporating conductive micro- or nano-structures into the oxide coating, may help reduce resistance of the oxide and may help reduce the potential drop. In addition, the conductive micro- and/or nano-structures may serve as a source of charge carriers, thereby helping to increase local charge carrier density and helping to increase the Richardson constant, thereby leading to higher maximum current densities afforded by oxide-coated cathodes. This higher maximum current density may be useful for thermionic converters and for other vacuum electronic devices which may benefit from a smaller voltage drop across the electrodes (both cathode and anode) and an increased supply of charge carriers to/from the substrate and/or conductive layer/matrix. Moreover, if a conductive oxide-coated electrode were used as an anode (that is, an electron absorber), then additional conductivity provided by micro- and nano-scale conductive structures disposed in the oxide coating may help permit the anode to absorb more current without significant heating.

Still by way of non-limiting overview, it will be appreciated that some embodiments of the oxide-coated electrode may have a work function less than 2 eV. For example, in some embodiments the oxide-coated electrode may have a work function around 1.4 eV or so. To that end, various embodiments of the oxide-coated cathodes can operate at low temperature (such as around 700-900 C or so) and may offer higher currents at temperatures below 900 C. Thus, a lower temperature regime of various embodiments of oxide-coated cathodes may help contribute to desirability of oxide cathodes compared to dispenser or $LaB_6$ cathodes. First, because oxide cathodes emit electrons at high current densities at temperatures below 900 C (in comparison to Ba dispenser cathodes), new applications may be possible for thermionic-type heat engines which entail lower temperature heat sources. Second, risk associated with fabrication and packaging of an entire device may be reduced. Similarly, lower temperatures may help reduce requirements for anti-corrosion coatings and barriers. Also, lower operating temperature may help increase device lifetime because depletion and evaporation of the electron-emitting material decreases with decreasing operating temperature.

It will also be appreciated that reducing the voltage drop across the oxide coating in a conductive oxide electrode may help improve the conversion efficiency of a thermionic converter. Operating at lower temperatures while maintaining high current density may also help increase the conversion efficiency of a thermionic converter, because lower cathode temperatures reduce blackbody radiation transfer between the cathode and collector.

It will also be appreciated that use of micro- and/or nano-technology may permit enhanced control of surface roughness in creating smoother surfaces. Use of micro- and/or nano-technology also may enable enhanced control over structural properties of films, such as without limitation microstructure of the film, size of grains, porosity, and the like.

Because oxide electrodes often rely on a chemical reaction between the alkali- or alkaline-earth metal oxide with a reducing agent or other activating species, increased surface area of the conductive structure or matrix containing the reducing agent may help improve the supply of an activating species and, thus, the efficiency of the electron emission or absorption process.

Additionally, when the conductive barium oxide-composite structure is used as an anode (that is, an electron absorber), the additional conductivity provided by the micro- and nano-scale conductive structures may help allow the anode to absorb more current without significant heating. As mentioned above, barium oxide can afford a lower work function than Ba. The combination of a conductive material with no or reduced potential drop as described above (which also affords a low work function surface) may help provide an efficiency boost to thermionic converters.

To that end, in a non-limiting embodiment a conductive oxide-coated electrode includes: a conductive layer; and an oxide coating disposed on the conductive layer. In another non-limiting embodiment, a conductive oxide-coated electrode includes: a substrate; a conductive layer disposed on the substrate, the conductive layer including patterned features defined therein; and an oxide coating disposed on the conductive layer. In another non-limiting embodiment, a conductive oxide-coated electrode includes: a patterned substrate; a conductive layer conformally deposited on the patterned substrate; and an oxide coating disposed on the conductive layer. In another non-limiting embodiment, a conductive oxide-coated electrode includes: a substrate; and at least one composition disposed on the substrate, the composition being formed by a conductive layer and an oxide coating, the composition being chosen from an alloy, a composite, and a combination of an alloy and a composite. In another non-limiting embodiment, a conductive oxide-coated electrode includes: a substrate; and an oxide coating disposed on the substrate, the oxide coating having conductive material disposed therein. In other non-limiting embodiments, methods are provided for fabricating the illustrative oxide-coated electrodes disclosed herein.

Illustrative Examples of Electrodes

Now that a non-limiting overview has been provided, illustrative details will be set forth below by way of non-limiting examples and not of limitation.

Figure 1B:
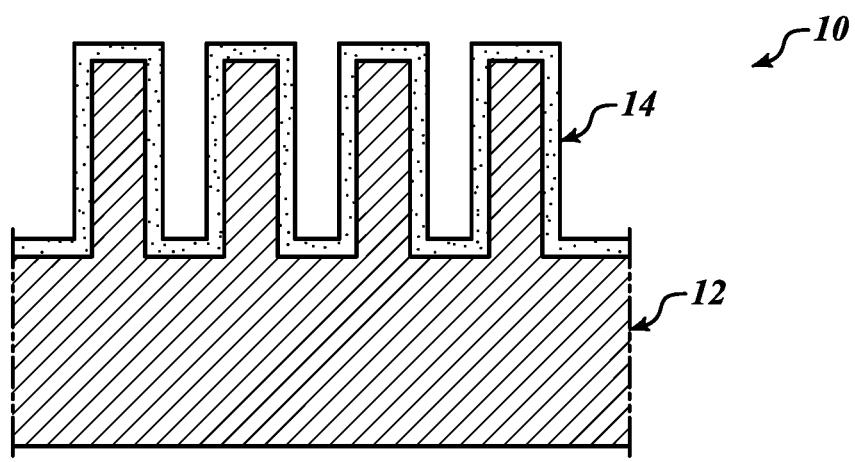

Referring to FIGS. 1A and 1B, illustrative, non-limiting embodiments of an oxide-coated electrode 10 include a conductive layer 12 and an oxide coating 14 disposed on the conductive layer 12. As discussed above, in some embodiments the electrode 10 may include electron-emitting cathodes and in some other embodiments the electrode 10 may include electron-absorbing anodes. As shown in FIG. 1A, in some embodiments the oxide coating 14 fills in space between features that are patterned in the conductive layer 12. As such, the oxide coating 14 may be considered to be "embedded" in the conductive layer 12. It will be appreciated that micro- and/or nano-technology may be used to pattern the conductive layer 12 into ridges and other patterns of various dimensions and pitches as desired and to deposit the oxide coating 14 between or on these patterns in a manner having increased precision over conventional methods such that the oxide coating 14 fills the space between the features of the conductive layer 12. As shown in FIG. 1B, in some other embodiments the oxide coating 14 is conformally deposited on the patterned features of the conductive layer 12.

In various embodiments, the conductive layer 12 may include metals, metal alloys, semiconductors, carbon nanotubes, porous nanomaterial film, carbon fibers, carbon ribbons, graphene, graphite, chalcogenides, and/or hexaborides. It will be appreciated that, in various embodiments, the conductive layer 12 may be deposited as a film. It will also be appreciated that in some embodiments the conductive layer 12 may provide sufficient structural integrity to serve as a substrate without provision of a separate, independent substrate. It will be further appreciated that, in some other embodiments (discussed below), a separate, independent substrate may be provided as desired for a particular application.

In some embodiments, metal in the conductive layer 12 may include tungsten, nickel, molybdenum, tantalum, titanium, platinum, gold, iridium, osmium, and/or palladium. In some embodiments, chalcogenides in the conductive layer may include molybdenum sulfide and/or molybdenum silicide. In some embodiments hexaborides in the conductive layer 12 may include lanthanum and/or cerium hexaboride.

In some embodiments the conductive layer 12 may be made by lithography. In some other embodiments, the conductive layer 12 may be a conductive carbon nanotube film optionally made by vacuum filtration, spray coating, and/or another deposition method, or other porous nanomaterial film. Various compositions and weight fractions may be varied and optimized as desired for a particular application.

In various embodiments, the oxide coating 14 may include an alkali metal oxide compound, an alkaline-earth metal compound, aluminum oxide, and/or thorium oxide. The alkaline-earth metal compound may include an alkaline-earth metal oxide compound and/or an alkaline-earth metal carbonate compound. The alkaline-earth metal oxide compound may include barium oxide, strontium oxide, aluminum oxide, and/or calcium oxide. The alkaline-earth metal carbonate compound may include barium carbonate, strontium carbonate, and/or calcium carbonate.

In some embodiments, the oxide coating 14 may further include at least one solvent, at least one binder, at least one reducing/activating agent, at least one additive, and/or a protective layer. The solvent may include an organic solvent and/or an inorganic solvent. The organic solvent may include alcohol, acetone, amyl acetate, ether, methyl alcohol, diethyl carbonate, diethyl oxalate, and/or triethanol amine. The inorganic solvent may include an aqueous solution. The binder may include nitrocellulose and/or ethylene glycol. The reducing/activating agent may include Mg, Zr, Al, Si, Th, Be, Hf, Sc, Y, Sm, Nd, Pr, La, U, Ce, Ti, C, Ta, Mn, B, W, Cr, Mo, Ga, Zn, V, Fe, Ni, Co, Cu, Au, Ag, Pt, Cd, Sb, Bi, Ir, Tl, Pd, Ru, Rh, and/or Os. The additive may include Os, scandium oxide, Re, Ir, and/or thorium oxide. The protective layer may include an organic lacquer.

Figure 1C:
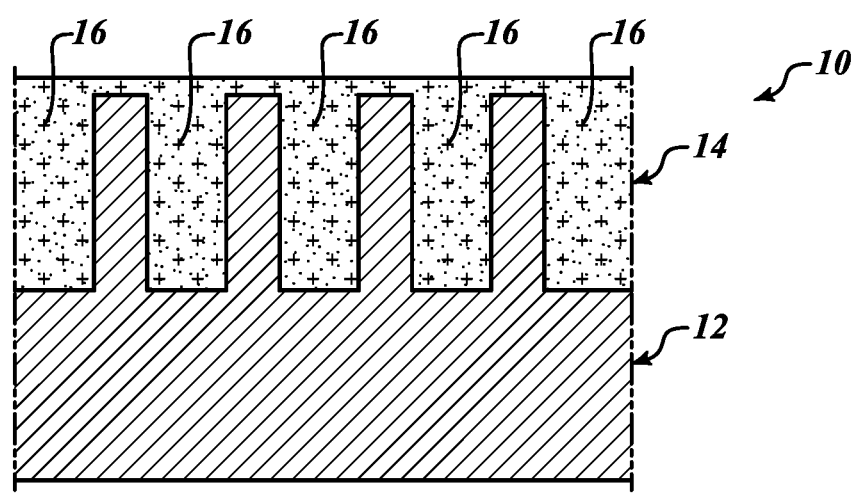

Referring additionally to FIG. 1C, in some embodiments conductive material 16 may be disposed in the oxide coating 14. In such embodiments the conductive material 16 forms a conductive path through the oxide coating 14 to the conductive layer 12. As a result, charge carriers may flow from the conductive layer 12 to particles (described below) in the conductive material 16. It will be appreciated that such a flow path may be an easier flow path to follow than a path through the resistive oxide coating 14 alone.

In various embodiments, the conductive material 16 may include metal particles, carbon nanotubes, and/or graphite. The metal particles may include micro-scale metal particles and/or nano-scale metal particles. The nano-scale metal particles may include nanoparticles and/or nanowires.

In some embodiments, the conductive material 16 may be mixed with metal carbonate precursor materials. The metal carbonate precursor materials may include barium carbonate, strontium carbonate, calcium carbonate, and/or aluminum oxide.

It will be appreciated that various nanoparticles and nanowires may include a variety of possible compositions, sizes, and shapes, as desired for a particular application. Micro- and/or nano-scale particle shapes may include, but are not limited to spherical, cylindrical, rod-like, wirelike, and discoidal shapes. The conductive particles may be made of noble metals such as Au, Ag, Pt, refractory metals such as W, Ta, Mo, Re, Nb or other metal such as Ti, Ni, Os, Cu, Al, In, Mg, semiconductors such as Si or Ge, and/or an alloy of the above.

Figure 1D:
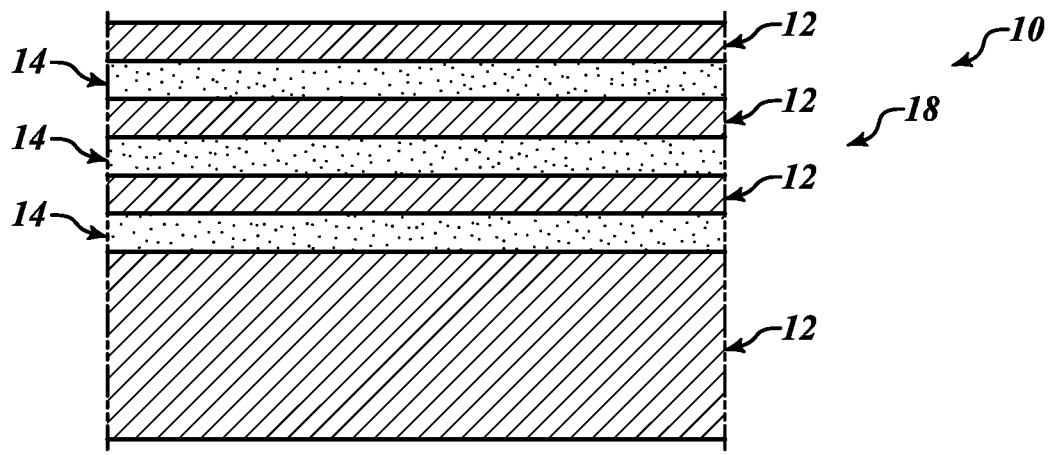
Figure 1E:
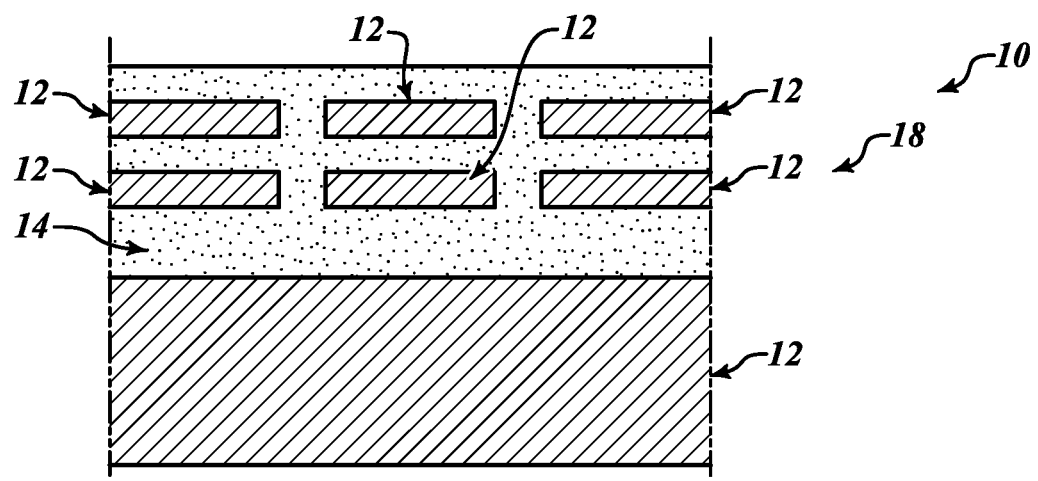

Referring additionally to FIGS. 1D and 1E, in some embodiments the conductive layer 12 and the oxide coating 14 may form a superlattice structure 18. In some such embodiments, the superlattice structure 18 may also include layers of a reducing/activating agent, a binder, and/or a protective layer. The reducing/activating agent may include Mg, Zr, Al, Si, Th, Be, Hf, Sc, Y, Sm, Nd, Pr, La, U, Ce, Ti, C, Ta, Mn, B, W, Cr, Mo, Ga, Zn, V, Fe, Ni, Co, Cu, Au, Ag, Pt, Cd, Sb, Bi, Ir, Tl, Pd, Ru, Rh, and/or Os. The binder may include nitrocellulose and/or ethylene glycol. The protective layer may include an organic lacquer.

The thickness and composition of each layer of the superlattice structure 18 may be varied and optimized via micro- and/or nano-technology and/or other film deposition processes as desired for a particular application. These techniques may help allow for a more precise control of the microstructure and surface properties of the superlattice structure 18 than could be achieved with other techniques. For example, surface roughness can be controlled to values ranging from 1 nm to 1,000 nm via chemical-mechanical planarization, bead blasting, other abrasive techniques, or chemical or physical etching techniques such as wet chemical etch, dry etching, and/or ion bombardment. As another example, thickness of the oxide coating 14 and the conductive layer 12 in the superlattice structure 18 can be controlled to values ranging from 0.3 nm to 1,000 nm via atomic layer deposition, physical vapor deposition, chemical vapor deposition, spray coating, spin coating, and the like. The superlattice structure 18 may include an arbitrary number of layers of arbitrary composition. For example, the superlattice could include alternating layers of the conductive layer 12, the oxide coating 14, a reducing/activating agent, a binder, and/or a protective layer. The electrode 10 can be activated (such as by heating via thermal annealing or the like) following deposition of the various layers. Such heating can result in diffusion such that different components of the superlattice structure 18 may diffuse at different rates into other layers and react with each other, thereby helping improve activation of the electrode 10.

As shown in FIG. 1E, the patterned conductive layer 12 does not need to be monolithic, and may include several distinct structures within the overall electrode 10. In the example shown in FIG. 1E, there are several layers of the conductive layer 12, and all but the bottom layer has pores to let the oxide coating 14 diffuse through the layers of the conductive layer 12.

Referring now to FIGS. 2A-2D, in various embodiments the electrode 10 may include a substrate 20 that is independent of the conductive layer 12. In such embodiments, the substrate 20 may include silicon, silicon nitride, silicon carbide, sapphire, glass, quartz, fused silica, plastic, gallium arsenide, gallium nitride, aluminum oxide, silicon oxide, and/or a metal. The metal may include tungsten, nickel, molybdenum, tantalum, titanium, and steel.

Figure 2A:
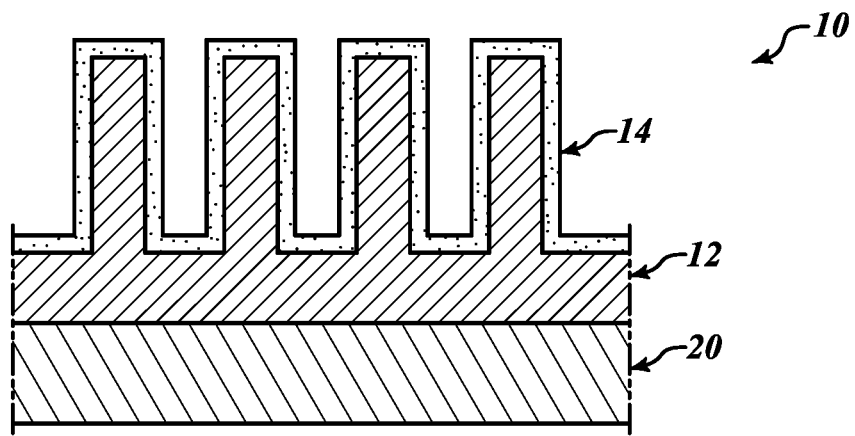
FIGS. 2A-2D illustrate examples of oxide-coated electrodes with an independent substrate.
Figure 2B:
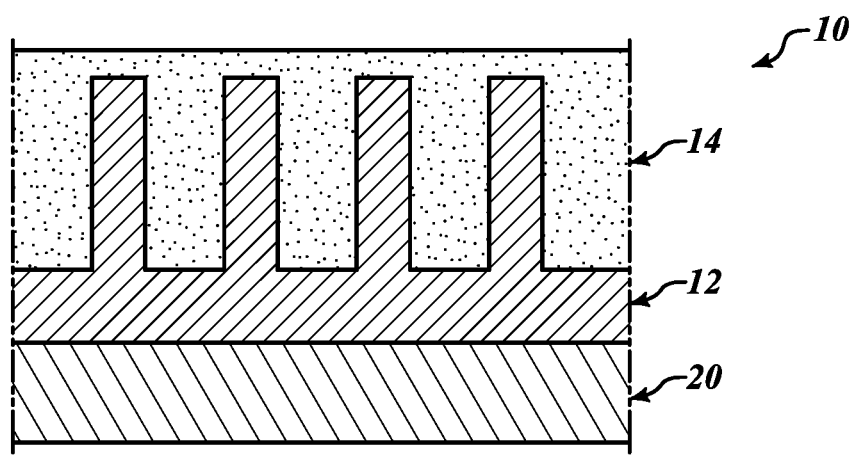

As shown in FIGS. 2A and 2B, in some embodiments the electrode 10 includes the substrate 20. The conductive layer 12 is disposed on the substrate 20. The conductive layer 12 includes patterned features defined therein. The oxide coating 14 is disposed on the conductive layer. As shown in FIG. 2A, the oxide coating 14 may be conformally deposited on the conductive layer 12. As shown in FIG. 2B, the oxide coating 14 fills space between the patterned features defined in the conductive layer 12.

Figure 2C:
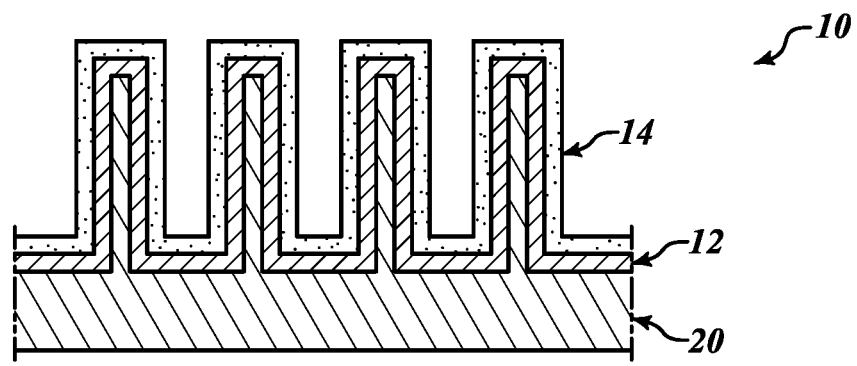
Figure 2D:
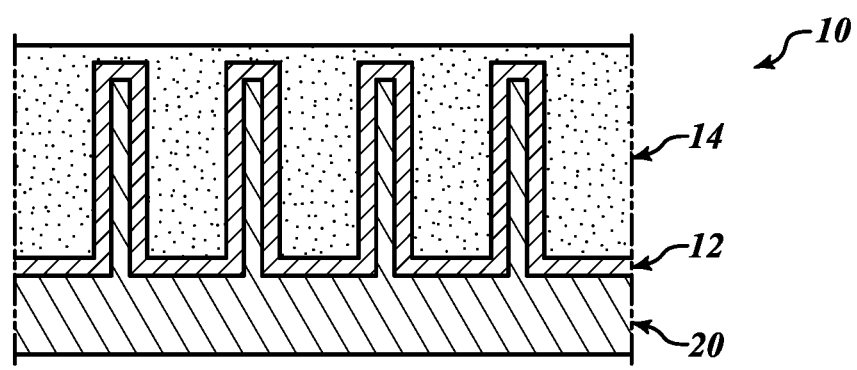

As shown in FIGS. 2C and 2D, in some embodiments the substrate 20 may be patterned. In such embodiments, the electrode 10 includes the patterned substrate 20. The conductive layer 12 is conformally deposited on the patterned substrate 20. The oxide coating is disposed on the conductive layer 12. As shown in FIG. 2C, the oxide coating 14 may be conformally deposited on the conductive layer 12. As shown in FIG. 2D, the oxide coating 14 fills space between the features of the conductive layer 12.

Figure 3:
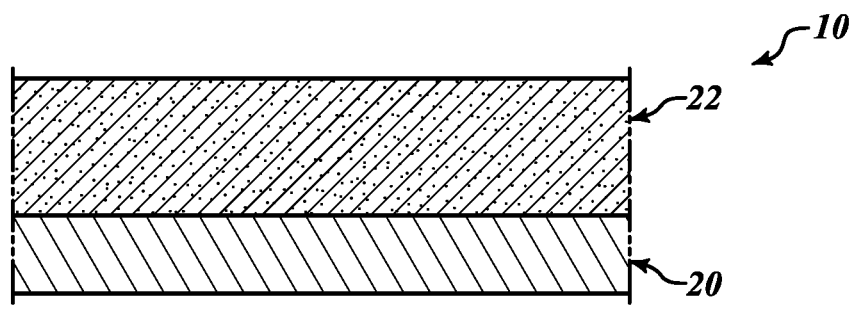
FIG. 3 illustrates another example of an oxide-coated electrode.

Referring additionally to FIG. 3, in some other embodiments the conductive layer 12 and the oxide coating 14 may be simultaneously deposited (or co-deposited) on a substrate. In such embodiments, the electrode 10 includes the substrate 20. At least one composition 22 is disposed on the substrate 20. The composition 22 is formed by simultaneous deposition, or co-deposition, of the conductive layer 12 and the oxide coating 14. The composition 22 may be an alloy, a composite, and/or a combination of an alloy and a composite.

It will be appreciated that various deposition techniques, such as without limitation vacuum filtration, co-sputtering, thermal evaporation, electron beam (e-beam) evaporation, spraying, spin coating, physical vapor deposition (PVD), chemical vapor deposition (CVD), atomic layer deposition (ALD), and the like, may be used as desired to simultaneously deposit the conductive layer 12 and the oxide coating 14. It will also be appreciated that, given by way of non-limiting example regarding a composite, Ba and barium oxide may form a composite with most refractories (such as without limitation W, Mo, Ta, Ni, Mg, Si, Ge). It will further be be appreciated that composition, weight fraction, spatial distribution of components, thickness, and the like may be varied and optimized, as desired for a particular application. Deposition conditions, including pressure, reactive gases, power, deposition rate, and/or temperature may also be adjusted as desired for a particular application. It will be appreciated that deposition may deposit simultaneously other components, such as a binder or other metal oxides or carbonates or salts that are useful to operation, activation, performance, lifetime, mechanical stability and/or thermal stability of the electrode 10, as desired.

Figure 4:
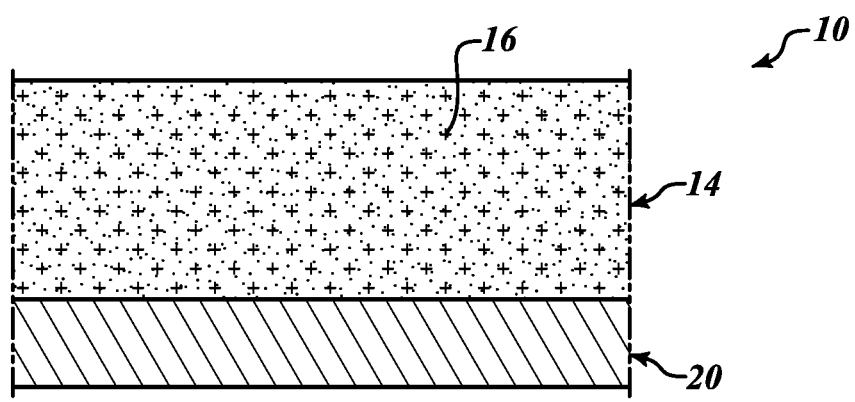
FIG. 4 illustrates another example of an oxide-coated electrode.

Referring additionally to FIG. 4, in some other embodiments the oxide coating 14 and the conductive material 16 may be simultaneously deposited (or co-deposited) on a substrate. In such embodiments, the electrode 10 includes the substrate 20. The oxide coating 14 is disposed on the substrate 20. The oxide coating 14 has the conductive material 16 disposed therein. It will be appreciated that the oxide coating 14 and the conductive material 16 may be deposited simultaneously using deposition techniques discussed above.

As discussed above, the electrode 10 may include electron-emitting cathodes or electron-absorbing anodes. Embodiments of the oxide-coated electrode 10 may help reduce electrical resistance of the semiconducting oxide coating 14, thereby helping contribute to improve lifetime and/or performance of oxide-coated thermionic cathodes or other vacuum electronic electrodes.

It will be appreciated that, as a result of use of micro- and/or nano-fabrication techniques discussed herein, in various embodiments the conductive layer 12 may define at least one feature with a size of less than 1 micron. In some embodiments the conductive layer 12 may define at least one feature with a size of less than 100 nm.

It will also be appreciated that, as a result of provision of the conductive layer 12 and/or the conductive material 16, in various embodiments the electrode 10 may have a work function less than 2 eV.

In various embodiments the electrode 10 has a tunable work function. Given by way of non-limiting examples, the work function of the electrode 10 may be tuned as follows. First, the conductive layer 12 may be tuned to match the practical application (temperature, integration with other parts, and the like) or extend device lifetime by choosing a desired material to mitigate failures. The conductive layer 12 can be comprised of a variety of metals, semiconductor, or conductive ceramics, or composites or alloys of the above. Tuning this conductor could be useful, for example, for different temperature range applications to match compatibility in terms of required mechanical properties (such as strength, coefficient of thermal expansion, hardness, and the like) as a function of temperature, compatibility with different device use environments (for example, oxygen vs. vacuum vs. air and the like), tuning the weight (for example, stainless or nickel would be lighter than tungsten or molybdenum), and the like.

Second, composition of the oxide coating 14 can be tuned with various oxides, carbonates, and other compounds of alkali and other metals. For example, compositions of Ca, Al, and Ba oxides and carbonates are tuned in order to adjust the work function of cathodes. Given by way of non-limiting example, composition of the carbonate precursor or the final oxide may be, for example, barium oxide, calcium oxide and aluminum oxide in the mole ratio of 5:3:2, respectively or 4:1:1, respectively. Such an approach could be useful for tuning the current density of different cathodes at different temperatures, tuning the material evaporation rate from a cathode, changing the activation temp of the cathode, changing the mechanical properties of the oxide coating 14, and the like. Also, mechanical properties of the oxide coating 14 can be tuned. For example, adhesiveness, hardness, coefficient of thermal expansion and other properties like the ability of the oxide to resist corrosion in various environments, or to prevent reaction with another part of the cathode or system, can be tuned for practical reasons as desired.

Third, the conductor:oxide ratio can be tuned. For example, the ratio of oxide materials in the oxide coating 14 to conductor in the conductive layer 12 may be varied if desired, such as in ratios of 1:1, 2:1, 1:2, 3:1, 1:3, and the like.

Figure 5:
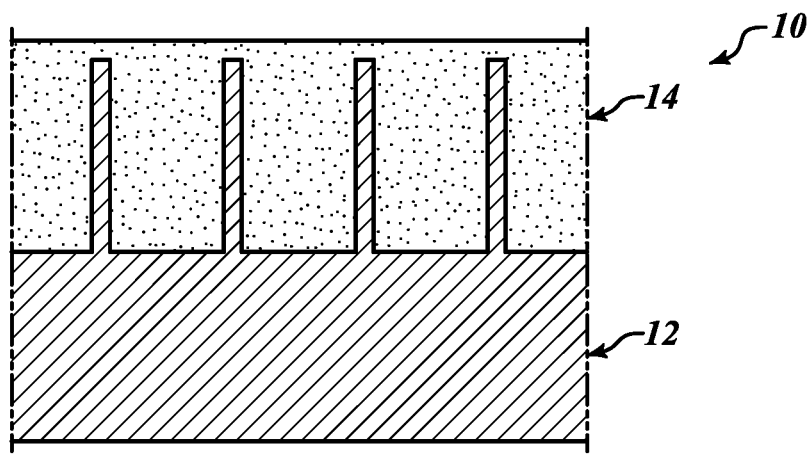
FIGS. 5 and 6 illustrate various surface-to-volume ratios and geometries of other examples of oxide-coated electrodes.
Figure 6:
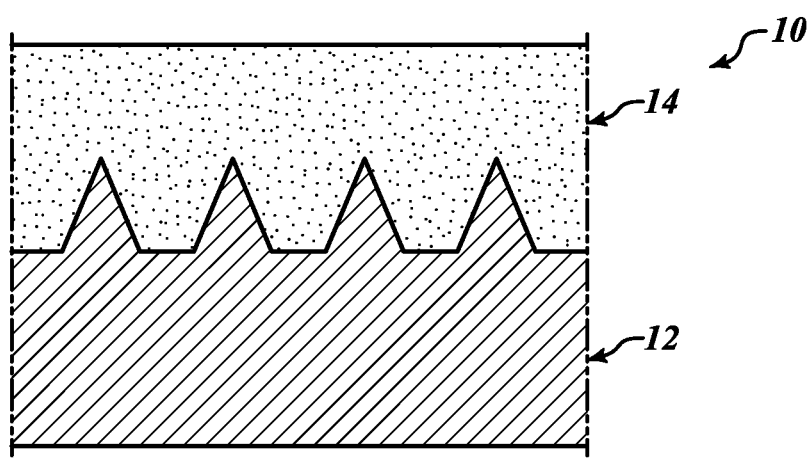

Referring briefly to FIGS. 1A, 1B, 2A, 2B, 5, and 6, it will also be appreciated that geometry (that is, pattern, pitch, fill factor, spatial distribution, and the like) of these metallic structures may be varied via photolithography, extreme UV lithography, deep UV lithography, double patterning, multiple and/or double patterning, nanoimprint lithography, block co-polymer lithography, electron beam lithography, wet or dry etching, annealing, physical or ion bombardment, self-assembly, and other fabrication techniques as desired to vary the surface-to-volume ratio and geometry of the structure. To that end, features of the patterned conductive layer 12 may be filled with the oxide coating 14 (FIGS. 1A and 2A). Also, the patterned conductive layer 12 may be coated conformally with the oxide coating 14 (FIGS. 1B and 2B). Moreover, the aspect ratio may be varied and optimized (FIG. 5). Further, the shape of the patterns may be varied and optimized (FIG. 6).

Illustrative Fabrication Methods

Illustrative, non-limiting examples of methods of fabricating embodiments of the conductive oxide coated electrode 10 are set forth.

Referring now to FIGS. 1A and 1B, in some embodiments a film of conductive material 12 is lithographically patterned and etched (via, for example, reactive ion etching, wet etch or another etch technique) to form desired geometry and features (see also FIGS. 5 and 6). In some other embodiments, the conductive material 12 may be shaped by selective area growth. Alternatively, a substrate (for example, a Si wafer) could also be used as a conductive film via etching features directly into the substrate. The oxide coating 14 is deposited on the patterned conductive material 12. The oxide coating 14 may be deposited via various deposition methods as desired (such as without limitation atomic layer deposition, physical vapor deposition, chemical vapor deposition, spray coating, spin coating, and the like) such that the oxide coating 14 is deposited conformally (FIG. 1B) or deposited uniformly over and through the patterned features (FIG. 1B)—also referred to herein as "embedded"—as desired for a particular application.

Referring to FIGS. 2A and 2B, in some embodiments the substrate 20 is provided. The conductive layer 12 is deposited on the substrate 20 as described above. The conductive layer 12 is patterned as described above. The patterned conductive layer 12 is etched as described above. The oxide coating 14 is conformally deposited on the etched conductive layer 12 (FIG. 2A) or deposited uniformly over and through the patterned features of the conductive layer 12 (FIG. 2B).

Referring to FIGS. 2C and 2D, in some embodiments the substrate 20 is provided. The substrate 20 is patterned. The patterned substrate 20 is etched. The conductive layer 12 is conformally deposited on the patterned substrate 20. The oxide coating 14 is conformally deposited on the conductive layer 12 (FIG. 2C) or deposited uniformly over and through the patterned features of the conductive layer 12 (FIG. 2D).

Referring to FIG. 3, in some embodiments the substrate 20 is provided. The conductive layer 12 and the oxide coating 14 are simultaneously deposited (co-deposited) on the substrate 20 as described above.

Referring to FIG. 4, in some embodiments the substrate 20 is provided. The oxide coating 14 and the conductive material 16 are simultaneously deposited (co-deposited) on the substrate 20 as described above.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

While a number of illustrative embodiments and aspects have been illustrated and discussed above, those of skill in the art will recognize certain modifications, permutations, additions, and sub-combinations thereof. It is therefore intended that the following appended claims and claims hereafter introduced are interpreted to include all such modifications, permutations, additions, and sub-combinations as are within their true spirit and scope.

What is claimed is:

1. A conductive oxide-coated electrode comprising:
   a conductive layer;
   an oxide coating deposited on the conductive layer; and
   conductive material disposed in the oxide coating, the conductive material including at least one conductive structure having a size on a scale chosen from a nano-scale and a micro-scale.

2. The electrode of claim 1, wherein the oxide coating is conformally deposited on the patterned features defined in the conductive layer.

3. The electrode of claim 1, wherein the oxide coating fills space between the patterned features defined in the conductive layer.

4. The electrode of claim 1, further comprising:
   a substrate, the conductive layer being disposed on the substrate.

5. The electrode of claim 4, wherein the oxide coating is conformally deposited on the patterned features defined in the conductive layer.

6. The electrode of claim 4, wherein the oxide coating fills space between the patterned features defined in the conductive layer.

7. The electrode of claim 4, wherein:
   the substrate is patterned with features defined therein on a scale chosen from a nano-scale and a micro-scale; and
   the conductive layer is conformally deposited on the patterned substrate.

8. The electrode of claim 4, wherein the substrate includes at least one material chosen from silicon, silicon nitride, silicon carbide, sapphire, glass, quartz, fused silica, plastic, gallium arsenide, gallium nitride, aluminum oxide, silicon oxide, and a metal.

9. The electrode of claim 7, wherein the oxide coating is conformally deposited on the conductive layer.

10. The electrode of claim 7, wherein the oxide coating fills space between features of the conductive layer.

11. The electrode of claim 1, wherein the conductive layer includes at least one type of material chosen from metals, metal alloys, semiconductors, porous nanomaterial film, carbon fibers, carbon ribbons, graphene, chalcogenides, and hexaborides.

12. The electrode of claim 11, wherein the hexaborides include at least one hexaboride chosen from lanthanum and cerium hexaboride.

13. The electrode of claim 1, wherein the oxide coating includes at least one compound chosen from an alkali metal oxide compound, an alkaline-earth metal compound, aluminum oxide, and thorium oxide.

14. The electrode of claim 13, wherein the alkaline-earth metal compound includes at least one compound chosen from an alkaline-earth metal oxide compound and an alkaline-earth metal carbonate compound.

15. The electrode of claim 14, wherein the alkaline-earth metal oxide compound includes at least one oxide chosen from barium oxide, strontium oxide, aluminum oxide, and calcium oxide.

16. The electrode of claim 14, wherein the alkaline-earth metal carbonate compound includes at least one carbonate chosen from barium carbonate, strontium carbonate, and calcium carbonate.

17. The electrode of claim 1, wherein the conductive material includes at least one material chosen from metal particles, carbon nanotubes, and graphite.

18. The electrode of claim 1, wherein the conductive layer and the oxide coating form at least one composition chosen from an alloy, a composite, and a combination of an alloy and a composite.

19. The electrode of claim 1, wherein the conductive layer and the oxide coating form a superlattice structure.

20. The electrode of claim 19, wherein the superlattice structure includes a plurality of layers chosen from a conductive layer, an oxide coating, a reducing/activating agent, a binder, and a protective layer.

21. The electrode of claim 1, wherein the conductive oxide-coated electrode is configured as an electron emitting electrode.

22. The electrode of claim 1, wherein the conductive oxide-coated electrode is configured as an electron absorbing electrode.

23. The electrode of claim 1, wherein the conductive material includes at least one feature with a size of less than 1 micron.

24. The electrode of claim 23, wherein the conductive material includes at least one feature with a size of less than 100 nm.

25. The electrode of claim 1, wherein the electrode has a work function less than 2 eV.

26. The electrode of claim 1, wherein the electrode has a tunable work function.

27. A conductive oxide-coated electrode comprising:

a substrate;

a conductive layer disposed on the substrate;

an oxide coating disposed on the conductive layer; and conductive material disposed in the oxide coating, the conductive material including at least one conductive structure having a size on a scale chosen from a nano-scale and a micro-scale.

28. A conductive oxide-coated electrode comprising:

a substrate; and at least one composition disposed on the substrate, the composition being formed by a conductive layer and an oxide coating, the oxide coating being disposed on the conductive layer, the oxide coating including conductive material disposed therein, the conductive material including at least one conductive structure having a size on a scale chosen from a nano-scale and a micro-scale, the composition being chosen from an alloy, a composite, and a combination of an alloy and a composite.

* * * * *